(12) United States Patent
Schwerdt et al.

(10) Patent No.: US 12,092,686 B2
(45) Date of Patent: Sep. 17, 2024

(54) APPARATUS AND METHOD FOR ELECTRICALLY COUPLING A UNIT UNDER TEST WITH A DEBUGGING COMPONENT

(71) Applicant: Western Digital Technologies, Inc., San Jose, CA (US)

(72) Inventors: Aleksandr Dean Schwerdt, Rowland Heights, CA (US); Daniel Roy Ostrander, Lake Forest, CA (US); David Alexander Jachmann, Corona, CA (US); Lynn Charles Berning, Rochester, MN (US); Robert Joseph Harvey, Rowland Heights, CA (US); Eric Lee Severtson, San Clemente, CA (US); Curtis Adam Harper, Berthoud, CO (US)

(73) Assignee: Western Digital Technologies, Inc., San Jose, CA (US)

( * ) Notice: Subject to any disclaimer, the term of this patent is extended or adjusted under 35 U.S.C. 154(b) by 357 days.

(21) Appl. No.: 17/550,682

(22) Filed: Dec. 14, 2021

(65) Prior Publication Data
US 2023/0184829 A1    Jun. 15, 2023

(51) Int. Cl.
G01R 31/317    (2006.01)

(52) U.S. Cl.
CPC . *G01R 31/31713* (2013.01); *G01R 31/31705* (2013.01)

(58) Field of Classification Search
CPC ........ G01R 31/31713; G01R 31/31712; G01R 31/317; G01R 31/2832; G01R 31/28; G01R 31/31705; G01R 31/36
See application file for complete search history.

(56) References Cited

U.S. PATENT DOCUMENTS 6,208,375 B1 *  3/2001  Kay ................... G01R 1/06705
                                                    348/95
7,463,042 B2 * 12/2008  Pereira ................... G01R 31/69
                                                  324/750.25
(Continued)

FOREIGN PATENT DOCUMENTS

CN    207781908 U    8/2018
CN    111043952 A    4/2020
KR    200341202 Y1   2/2004

OTHER PUBLICATIONS

Gannon, Mary; "Solderless and direct plug-in connectors"; Würth Elektronik; May 23, 2018; https://www.we-online.com/web/en/wuerth_elektronik/news_weg/news_archiv_2020_weg_2/news-detail-we-gruppe_109055.php; 8 pages.

*Primary Examiner* — Harshad C Patel
(74) *Attorney, Agent, or Firm* — LOZA & LOZA, LLP; Gabriel Fitch

(57) ABSTRACT

An apparatus for electrically coupling an electrical interface of a unit under test with a debugging component includes a bracket assembly having a socket configured to electrically couple with the electrical interface, a baseplate assembly configured to secure the unit under test on a plate, a crane assembly coupled to the bracket assembly, and a cable assembly. The crane assembly is configured to enable movement of the socket relative to the electrical interface in each of a horizontal direction, a vertical direction, and an angular direction; and secure the socket in place relative to the electrical interface while applying a force by the socket against the electrical interface. The cable assembly is associated in part with the bracket assembly and is configured to electrically couple with the socket at a first end and with the debugging component at a second end.

20 Claims, 14 Drawing Sheets

(56) References Cited

U.S. PATENT DOCUMENTS

| | | |
|---|---|---|
| 7,870,455 B2 | 1/2011 | Mayer |
| 11,221,349 B2 * | 1/2022 | Arlinsky ............ G01R 1/07392 |
| 2004/0019827 A1 | 1/2004 | Rohfleisch et al. |
| 2007/0001691 A1 * | 1/2007 | Pereira ................... G01R 31/69 |
| | | 324/750.25 |
| 2020/0006163 A1 | 1/2020 | Amir et al. |
| 2020/0064372 A1 * | 2/2020 | Arlinsky ............ G01R 1/06705 |

* cited by examiner

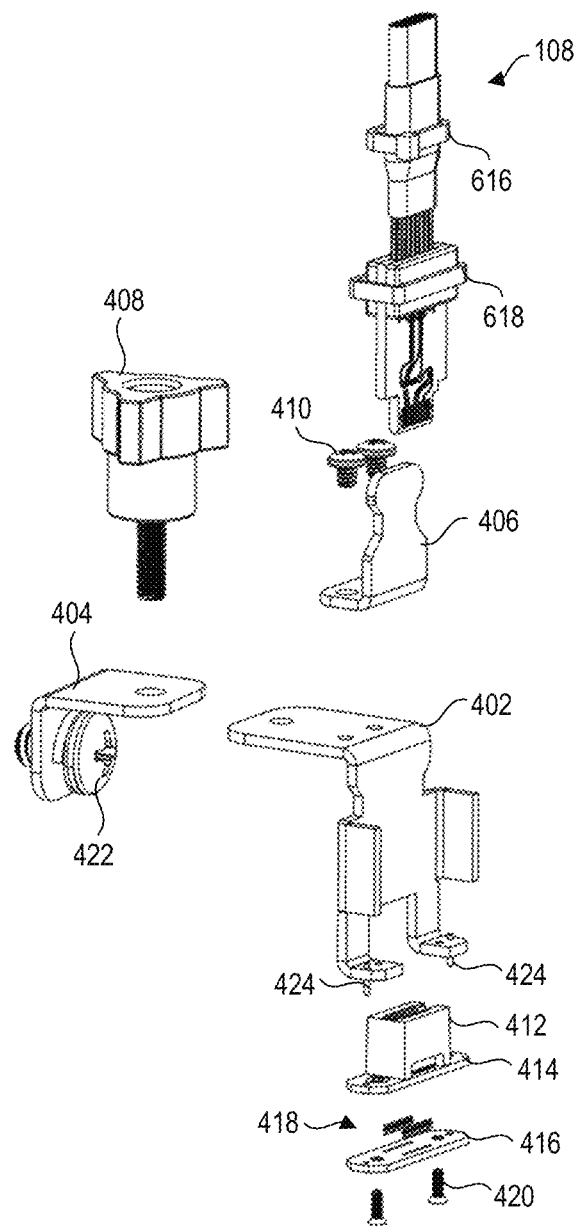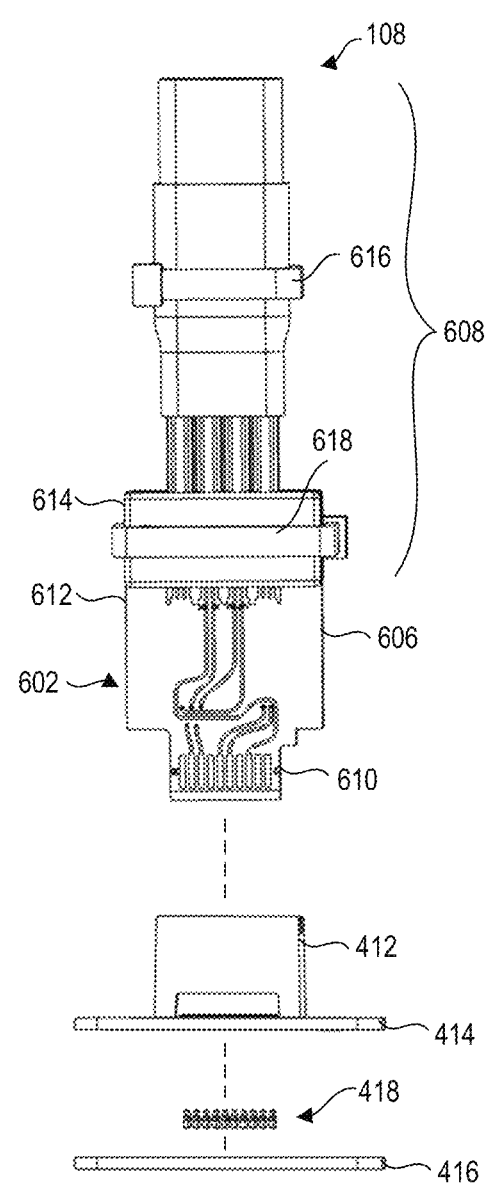
FIG. 6A
FIG. 6B

APPARATUS AND METHOD FOR ELECTRICALLY COUPLING A UNIT UNDER TEST WITH A DEBUGGING COMPONENT

FIELD

The disclosure relates, in some embodiments, to apparatuses and method for debugging one or more components of a printed circuit board assembly. More specifically, but not exclusively, the disclosure relates to apparatuses and methods for electrically coupling a printed circuit board assembly, acting as or including a unit under test, with a debugging component without requiring any rework, e.g., soldering, of the printed circuit board assembly.

INTRODUCTION

Hard disk drive and solid state data storage devices (hereafter referred to as HDD and SSD storage devices or drives) are embedded systems that incorporate non-volatile memories (NVMs), volatile memories (i.e. dynamic random access memories—DRAM), processors, and other integrated circuitry that may require testing and failure analysis. Going forward in this disclosure, a structure that requires testing and failure analysis is referred to as unit under test. Depending on the context, a unit under test may refer to a printed circuit board assembly (PCBA) with a processor that requires testing, or to a storage device (or a drive) having a PCBA with a processor that requires testing.

In order to test and analyze failures of a unit under test, a tool referred to herein as a debugging component or debugger is used. A debugger has the capability to control and record/trace the processor activity of a unit under test by connecting to signals directly linked to the processor of the unit under test. These signals are considered high speed with data rates of up to 12 Gigabits per second (Gbps). When routing high speed signals, it is paramount to minimize the impact of signal integrity concerns as this can affect the overall performance of the debugger by deteriorating the integrity of the data captured from the unit under test.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides an apparatus for electrically coupling an electrical interface of a unit under test with a debugging component. The apparatus includes a bracket assembly, a baseplate assembly, a crane assembly, and a cable assembly. The bracket assembly includes a socket configured to electrically couple with the electrical interface. The baseplate assembly has a plate and is configured to secure the unit under test on the plate. The crane assembly is coupled to the bracket assembly and configured to: enable movement of the socket relative to the electrical interface in each of a horizontal direction, a vertical direction, and an angular direction; and to secure the socket in place relative to the electrical interface by applying a force by the socket against the electrical interface. The cable assembly configured to electrically couple with the socket at a first end and with the debugging component at a second end.

One embodiment of the disclosure provides another apparatus for electrically coupling an electrical interface of a unit under test with a debugging component. The apparatus includes: means for positioning the unit under test so that the electrical interface is in a first plane; means for positioning a socket in a second plane parallel to, and spaced apart from, the first plane; means for aligning the socket with the electrical interface; means for moving the socket into electrical contact with the electrical interface; means for securing the socket in place relative to the electrical interface by applying a force by the socket against the electrical interface; and means for electrically coupling the socket with the debugging component.

One embodiment of the disclosure provides a method of electrically coupling an electrical interface of a unit under test with a debugging component. The method includes: positioning the unit under test so that the electrical interface lies in a first plane; positioning a socket in a second plane parallel to the first plane; aligning the socket with the electrical interface; moving the socket into abutting contact with the electrical interface; securing the socket in place relative to the electrical interface by applying a force by the socket against the electrical interface; and electrically coupling the socket with the debugging component.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 6A is an exploded, perspective illustration of the bracket assembly and the cable assembly of FIGS. 5A and 5B in accordance with one or more aspects of the disclosure.

FIG. 6B is an illustration of components of the bracket assembly and the cable assembly of FIGS. 5A and 5B in accordance with one or more aspects of the disclosure.

DETAILED DESCRIPTION

Figure 1A:
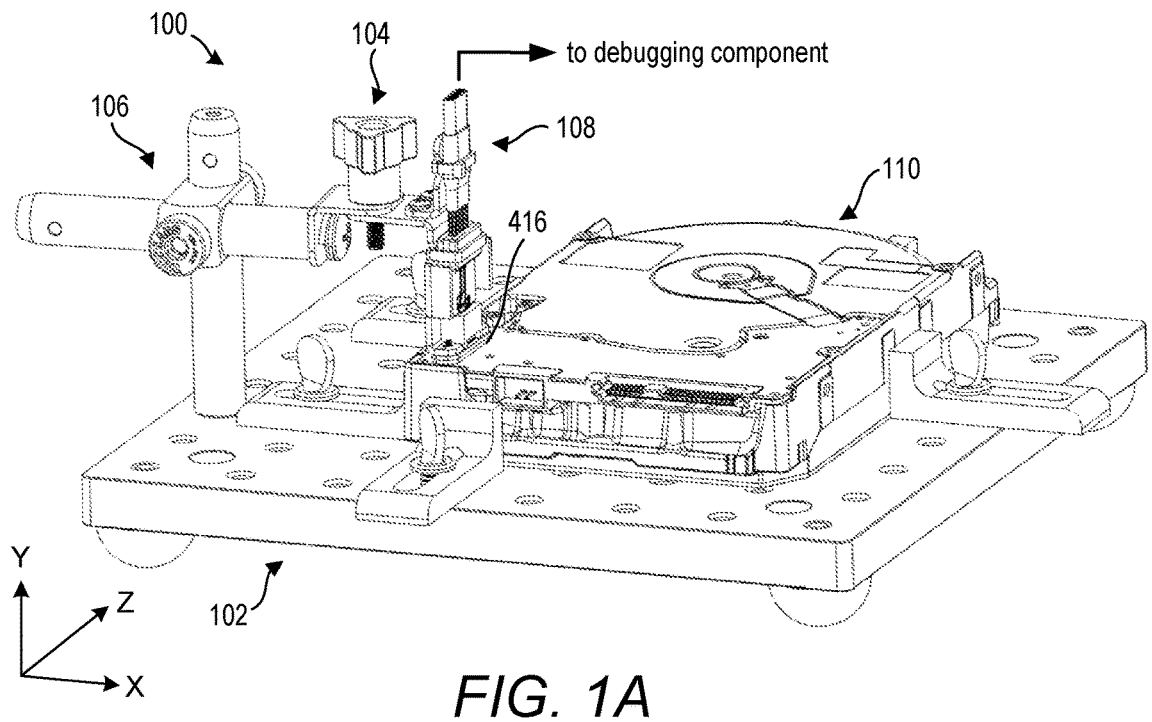
FIG. 1A is a perspective illustration of an apparatus for electrically coupling a unit under test with a debugging component in accordance with one or more aspects of the disclosure.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Typically, when transferring high speed signals from a unit under test to a debugger, a direct connection between the two components provides the best signal integrity.

To this end, in one conventional approach to debugging a unit under test, one connector of a high performance cable is directly soldered to the unit under test, while the other connector of the cable is attached to the debugging component. Soldering a connector to a PCBA of a storage device, however, changes the form factor of the storage device by increasing the height of the device. By changing the form factor of the storage device, the device may no longer be compatible with machines used during device manufacturing and testing. For example, a device with a connector soldered to it may not fit in a manufacturing machine. Because of this, a debugging approach that involves direct soldering to the unit under test is not ideal.

In another conventional approach to debugging a unit under test, one end of an interposer fixture is secured to the storage device and electrically coupled to debug pads exposed at the exterior of the storage device. The debug pads are part of a PCBA of the storage device of the unit under test. The other end of the interposer fixture includes a circuit assembly that provides electrical connections and a mechanical coupling mechanism for connection with a connector of a high-performance cable.

In this interposer approach, the end of the interposer secured to the storage device includes mechanical features configured to connect with corresponding mechanical features of the storage device, and electrical features configured to electrically couple with the debug pads. For example, the interposer may include set screws configured to mechanically couple with corresponding screw holes of the storage device, and an arrangement of electrically conductive pogo pins configured to align with a corresponding arrangement of debug pads of the PCBA of the storage device. This debugging approach, however, imposes PCBA design restrictions in that the PCBA is required to keep the debug pads of the PCBA in the exact same place relative to the drive screw holes of the storage device.

This interposer approach presents other issues. For example, once secured to the storage device, the form factor of the interposer may extend over test access points of the PCBA exposed through the storage device housing, and thereby prevent access to these other test points. Attaching an interposer board to the storage device also changes the form factor of the storage device as a system under test by increasing the height, width or length of the device depending on implementation. By changing the form factor of the storage device as a system, the device may no longer be compatible with machines used during device manufacturing and testing. For example, a device with an interposer attached may not fit in a manufacturing or customer machines. Furthermore, the interposer fixture may have unreliable signal integrity. For example, an interposer fixture having pogo pin electrical contacts may only be capable of supporting signal speeds of 3 Gbps reliably, which is insufficient considering that high speed data rates of up to 12 Gbps are required for newer processors.

Figure 1B:
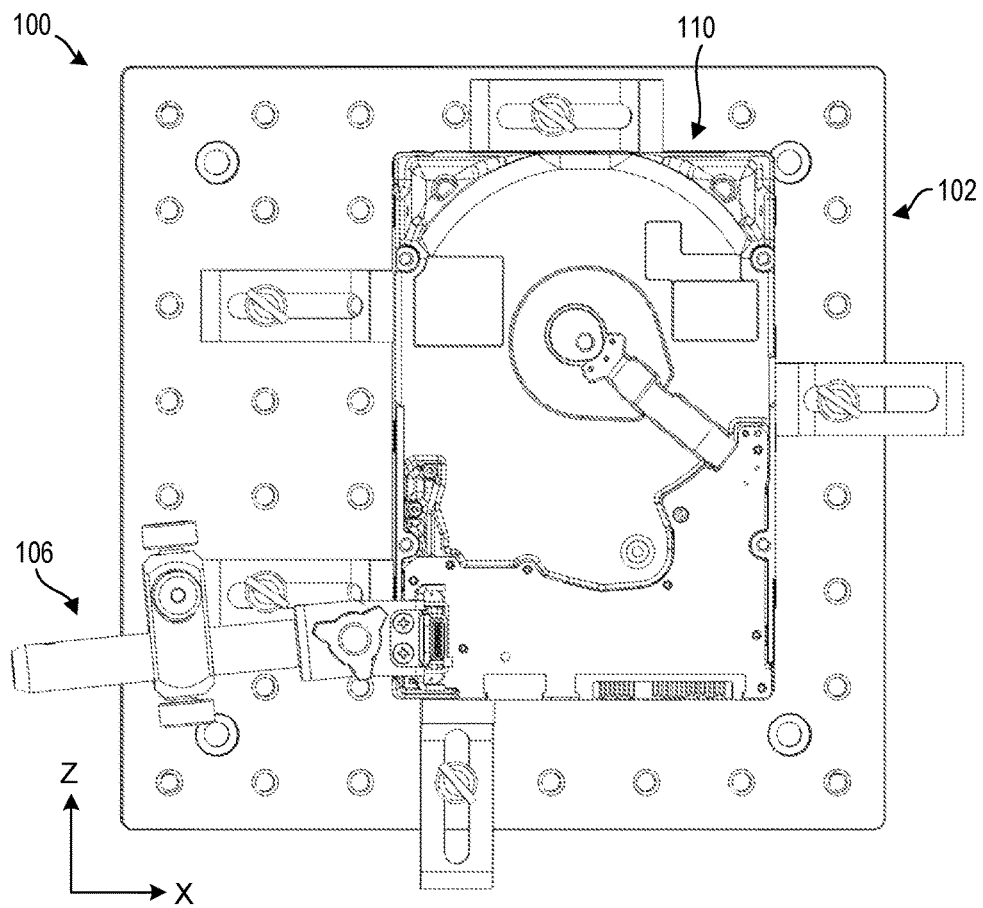
FIG. 1B is a top view illustration of the apparatus of FIG. 1A in accordance with one or more aspects of the disclosure.
Figure 2A:
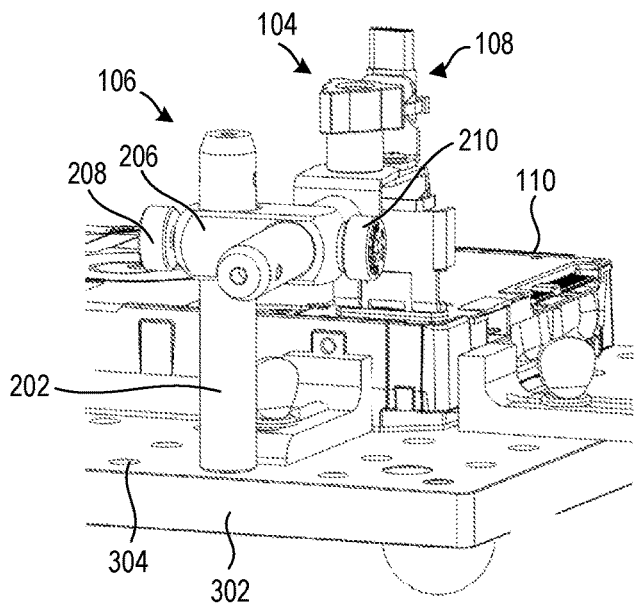
FIGS. 2A, 2B, and 2C are various perspective illustrations of a portion of an apparatus for electrically coupling a unit under test with a debugging component in accordance with one or more aspects of the disclosure.
Figure 2B:
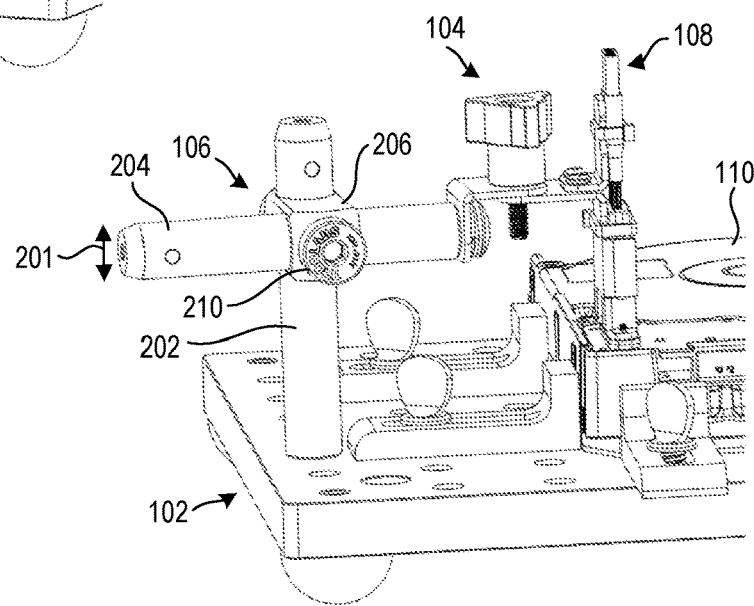
Figure 2C:
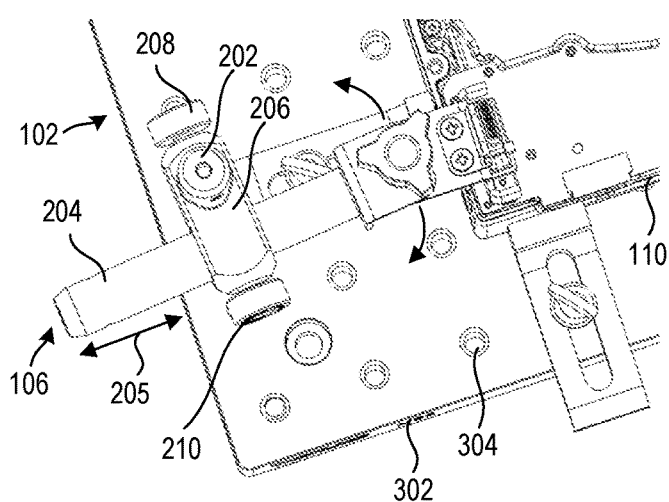
Figure 3A:
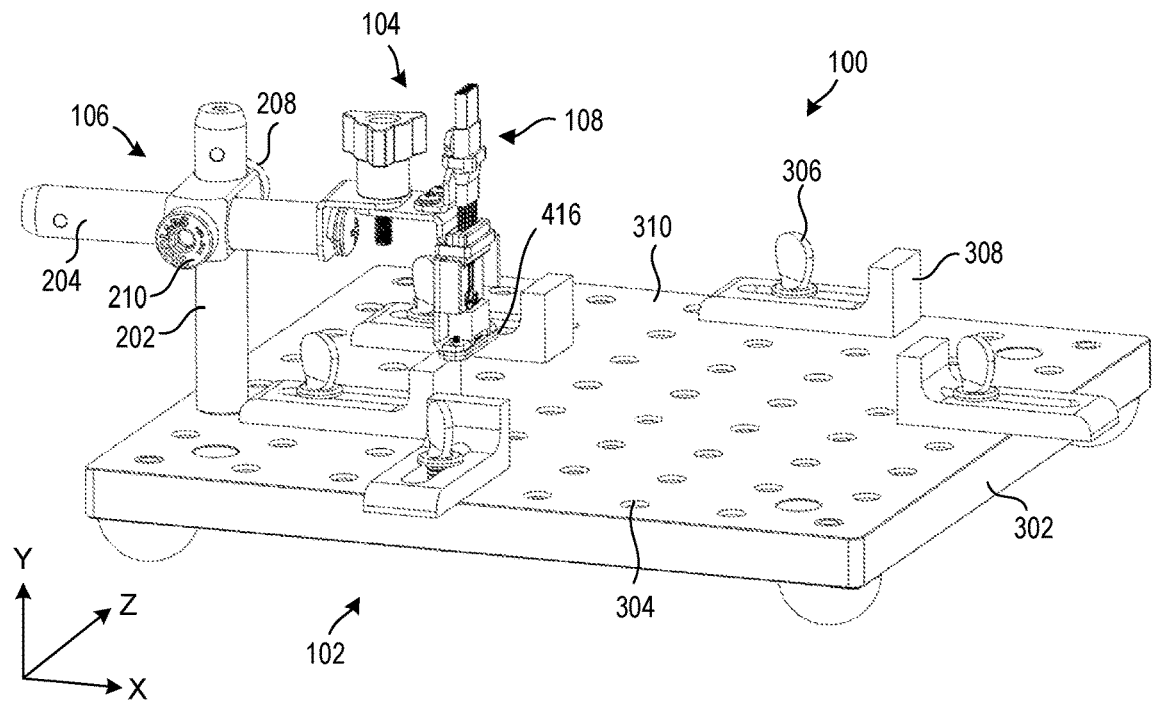
FIG. 3A is a perspective illustration of the apparatus of FIG. 1A without a unit under test and including a baseplate assembly, a bracket assembly, a crane assembly, and a cable assembly in accordance with one or more aspects of the disclosure.
Figure 3B:
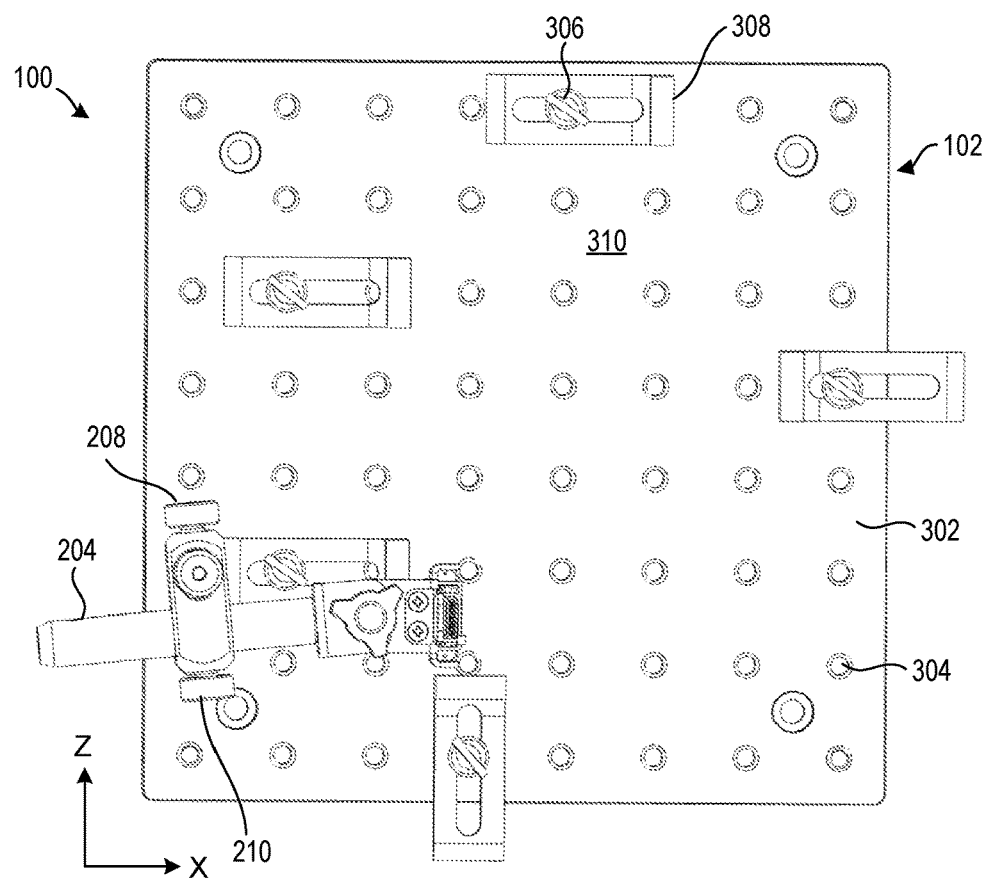
FIG. 3B is a top view illustration of the apparatus of FIG. 3A in accordance with one or more aspects of the disclosure.
Figure 3C:
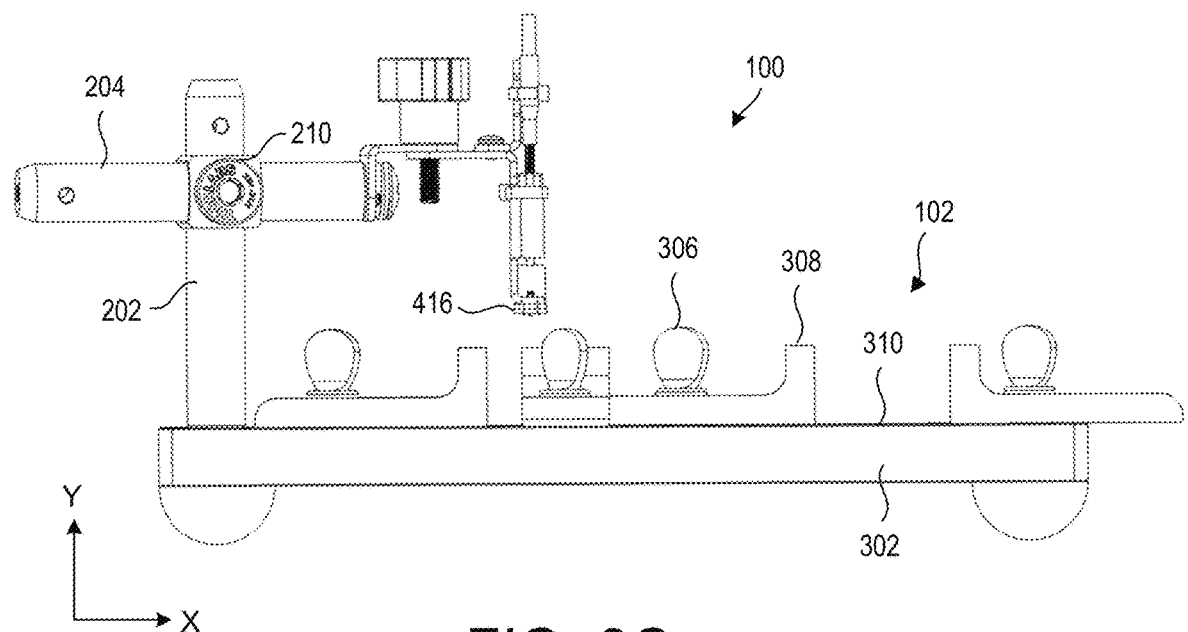
FIG. 3C is a side view illustration of the apparatus of FIG. 3A in accordance with one or more aspects of the disclosure.
Figure 3D:
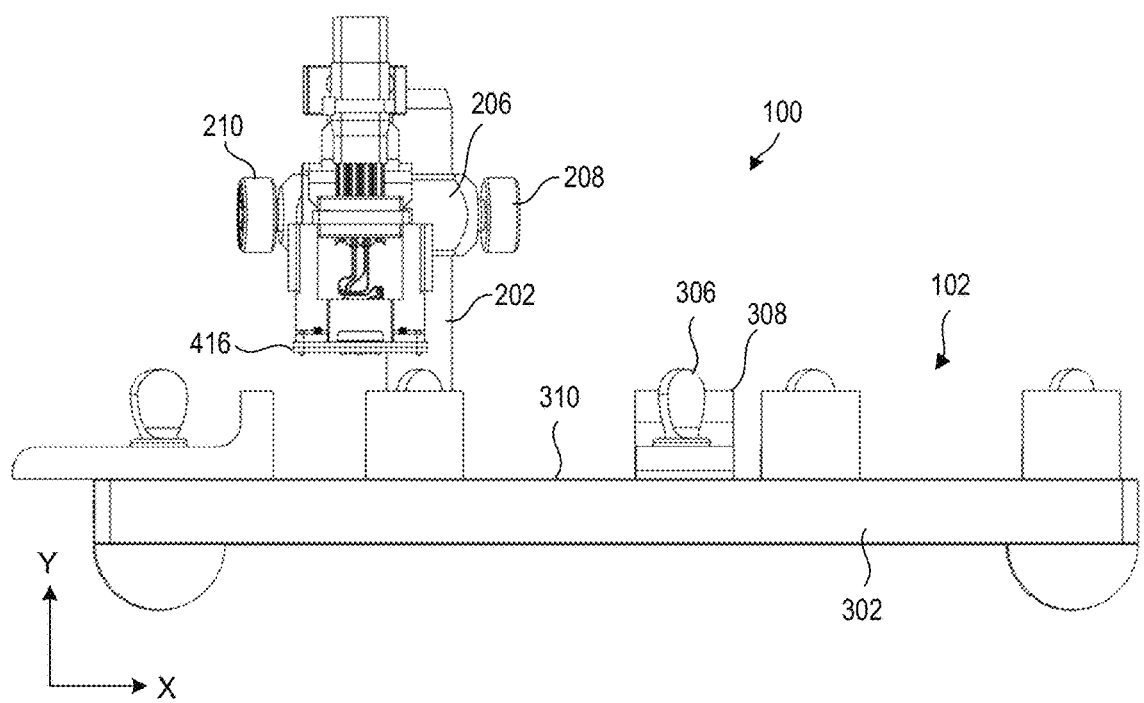
FIG. 3D is a front view illustration of the apparatus of FIG. 3A in accordance with one or more aspects of the disclosure.
Figure 4:
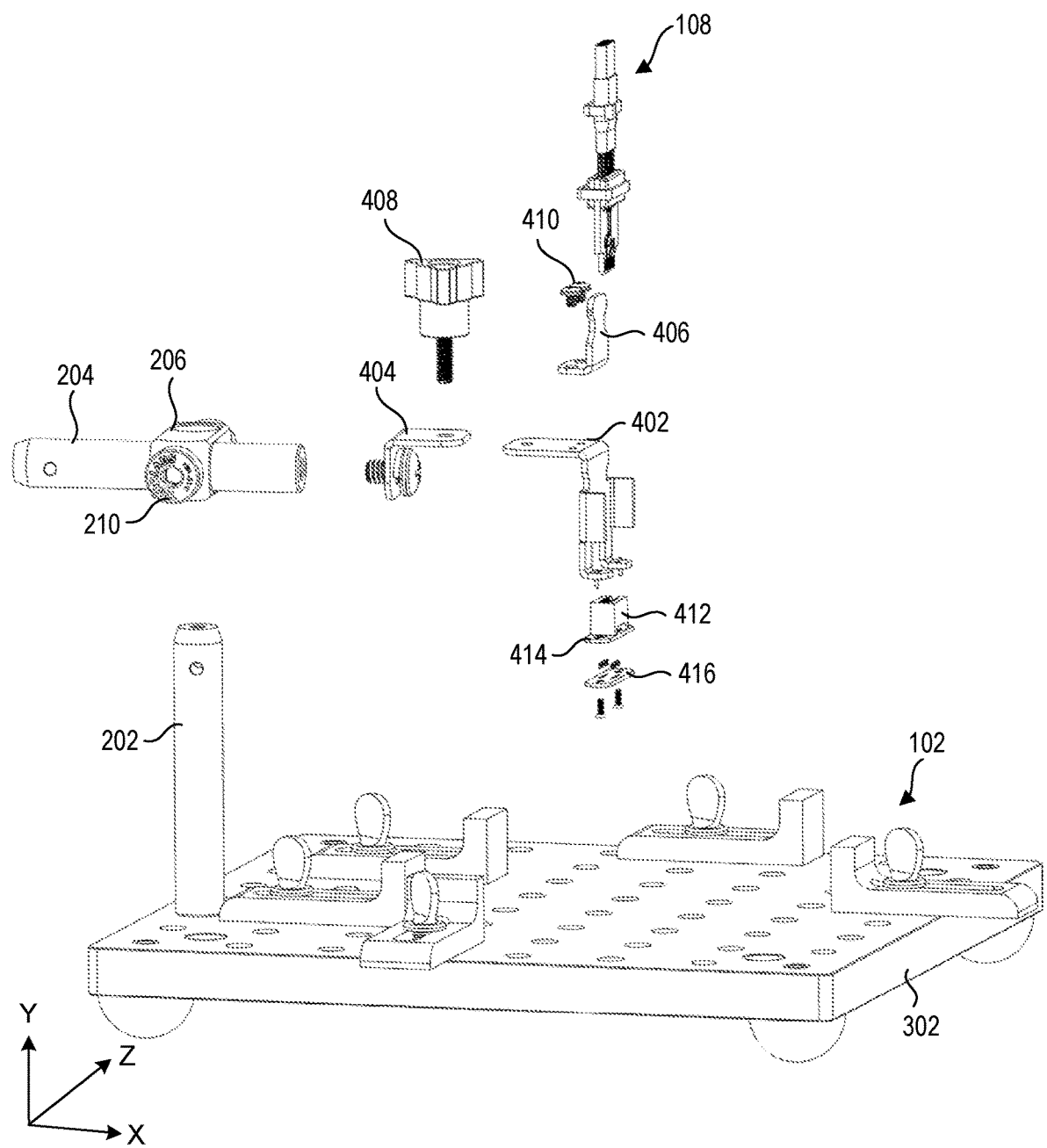
FIG. 4 is an exploded, perspective illustration of the apparatus of FIG. 3A in accordance with one or more aspects of the disclosure.

With reference to FIGS. 1A and 1B, in accordance with embodiments disclosed herein, an apparatus 100 for electrically coupling a unit under test 110 with a debugging component includes a baseplate assembly 102, a crane assembly 106, a bracket assembly 104, and a cable assembly 108. The cable assembly 108 is configured to electrically couple with the unit under test. The unit under test 110 may be, for example, a storage device (such as a solid state drive or a magnetic storage device such as a hard disk drive) having a rectangular form factor with a top, bottom, and sides. The unit under test 110 may include one or more PCBAs that require debugging.

Figure 11A:
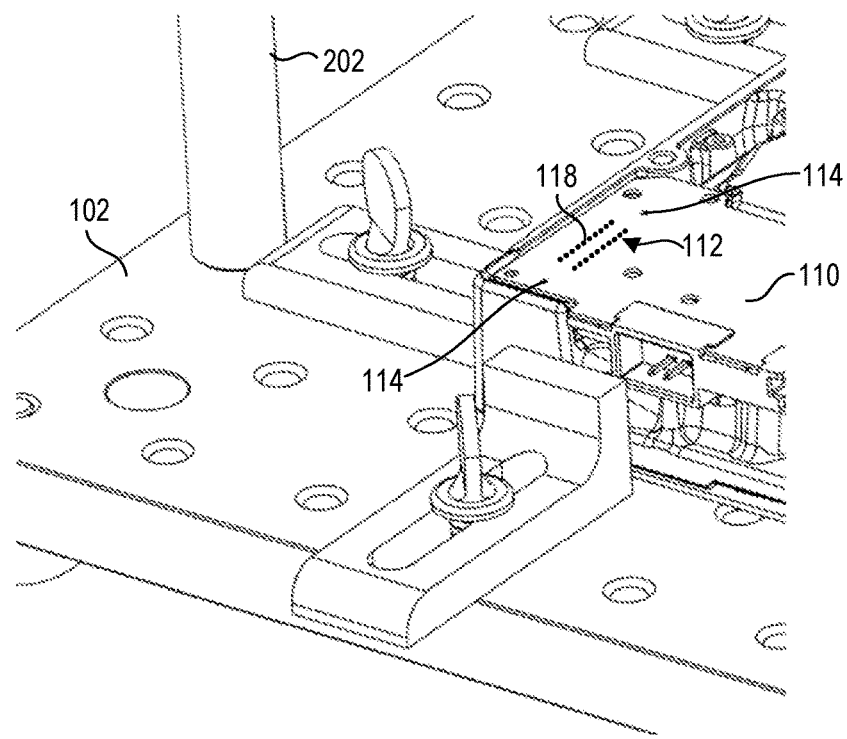
FIG. 11A is a perspective illustration of an example alignment feature adjacent an electrical interface of a unit under test with which a cable assembly (removed for clarity of illustration) of the apparatus of FIG. 3A is configured to engage in accordance with one or more aspects of the disclosure.
Figure 11B:
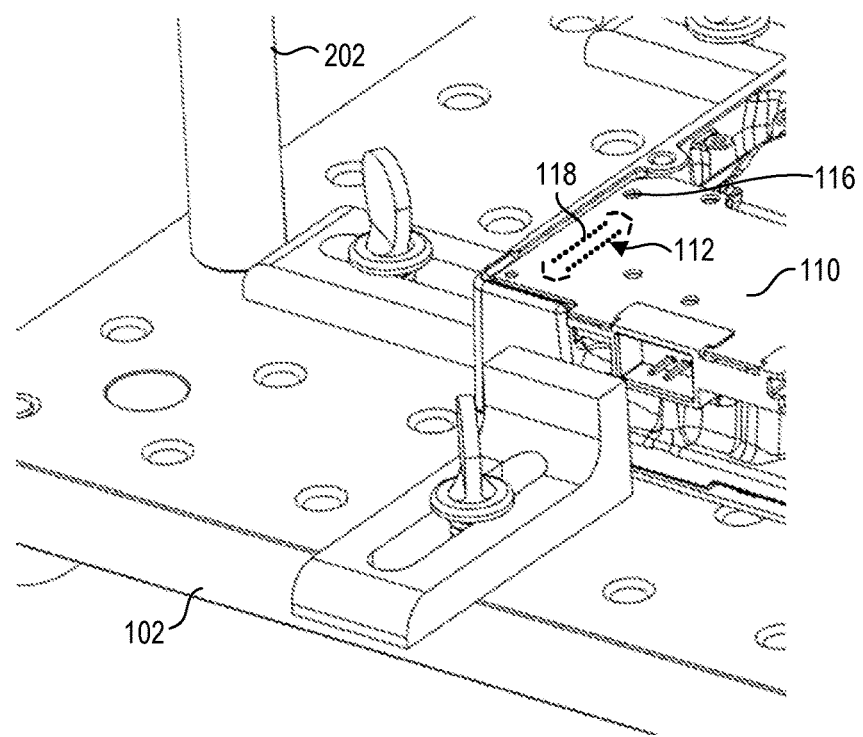
FIG. 11B is a perspective illustration of another example alignment feature adjacent an electrical interface of a unit under test with which a cable assembly (removed for clarity of illustration) of the apparatus of FIG. 3A is configured to engage in accordance with one or more aspects of the disclosure.
Figure 11C:
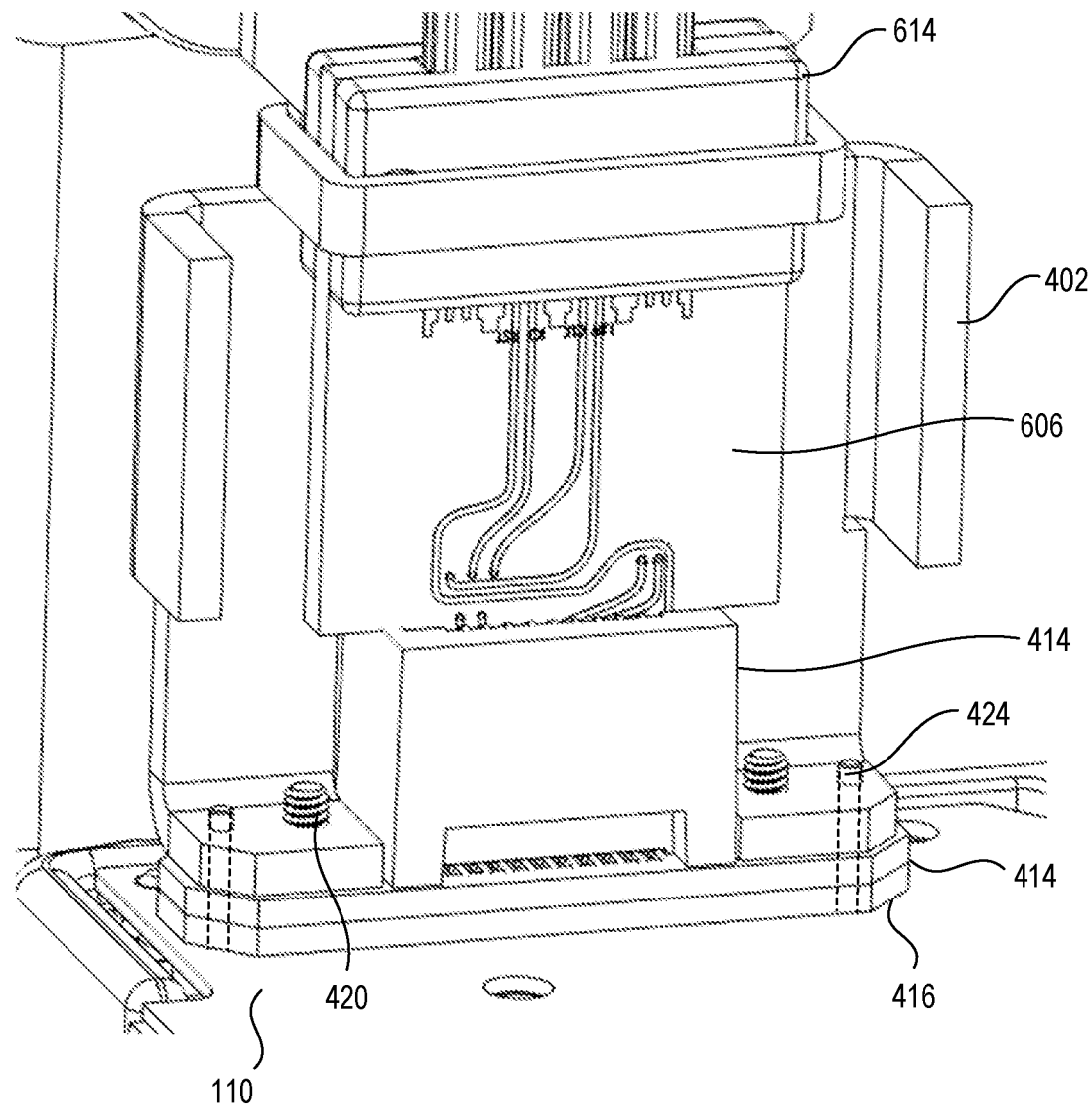
FIG. 11C is a perspective illustration of a socket of a cable assembly of the apparatus of FIG. 3A compressed against and engaged with an electrical interface (not visible) of a unit under test in accordance with one or more aspects of the disclosure.

With continued reference to FIGS. 1A and 1B, and additional reference to FIGS. 11A, 11B, and 11C, the baseplate assembly 102 is configured to secure a unit under test 110 in place to position an electrical interface 112 (also referred to as a "debugger footprint") of the unit under test for eventual coupling with a socket 416 of the cable assembly 108. The crane assembly 106 is configured to mechanically couple with the bracket assembly 104 and to enable movement of the bracket assembly and cable assembly 108 relative to the electrical interface 112 of the unit under test 110 to thereby enable alignment of the socket 416 of the cable assembly 108 with the electrical interface.

As shown in FIGS. 11A, 11B, and 11C, to facilitate electrical coupling with the cable assembly 108 of the apparatus 100, the unit under test 110 includes an electrical interface 112 with which a socket 416 of the cable assembly is configured to electrically connect. The electrical interface 112 of the unit under test 110 includes a number of electrical contacts 118 that are exposed through a top panel of the unit under test and that electrically connect with one or more PCBAs within the unit under test. The electrical contacts 118 and the region of the top panel define the electrical interface 112 (or debugger footprint) of the unit under test 110.

To further facilitate electrical coupling with the apparatus 100, the unit under test 110 may also include an alignment feature 114, 116. For example, with reference to FIGS. 11A and 11C, in some embodiments the top panel of the unit under test 110 may include a pair of alignment holes 114 adjacent the electrical interface 112 that are positioned and configured to engage corresponding alignment pins 424 of the cable assembly 108. As will be described further below, the alignment holes 114 and alignment pins 424 function together to ensure good alignment and electrical coupling between the electrical contacts 118 of the unit under test 110 and electrical socket pins 418 of the cable assembly 108.

With reference to FIG. 11B, in some embodiments the top panel of the unit under test 110 may include alignment markers 116 around the electrical interface 112 that are arranged to define an outline that matches the outline of the socket 416 of the cable assembly 108. As will be described further below, the alignment markers 116 provide visual guidance during electrical coupling of the socket 416 of the cable assembly 108 with the electrical interface 112 of the unit under test 110.

With reference to FIGS. 12A, 13A, 13B, and 14, in some embodiments the top panel of the unit under test 110 do not include an alignment feature. Instead the apparatus 100 further includes an alignment bracket 1202 that is configured to couple to the unit under test 110. The alignment bracket 1202 includes a side portion 1204 and a window frame portion 1206. The side portion 1204 is configured to secure to a sidewall of the unit under test 110. For example, with reference to FIG. 13A, the side portion 1204 may be secured to a sidewall 1210 of a unit under test 110 by screws 1214. In some embodiments, the alignment bracket 1202 is formed of plastic and may be 3D printed.

Figure 12A:
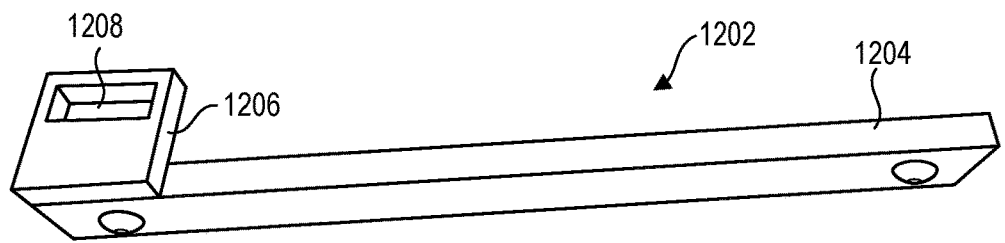
FIGS. 12A and 12B are perspective illustrations of an alignment mechanism for aligning a socket of a cable assembly with an electrical interface of a unit under test in accordance with one or more aspects of the disclosure.
Figure 12B:
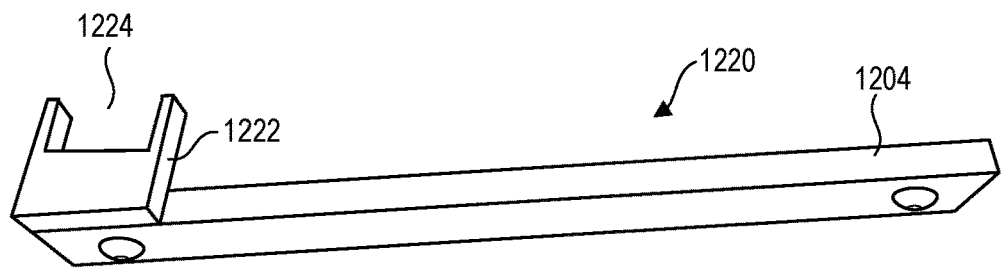
Figure 13A:
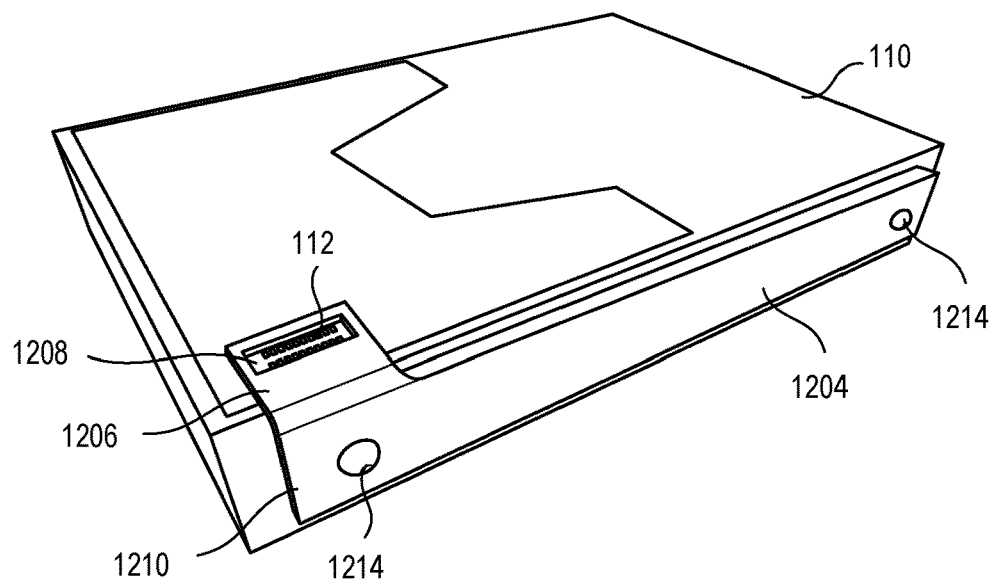
FIG. 13A is a perspective illustration of the alignment mechanism of FIG. 12A attached to a unit under test and exposing the electrical interface of the unit under test through an opening or window in accordance with one or more aspects of the disclosure.
Figure 13B:
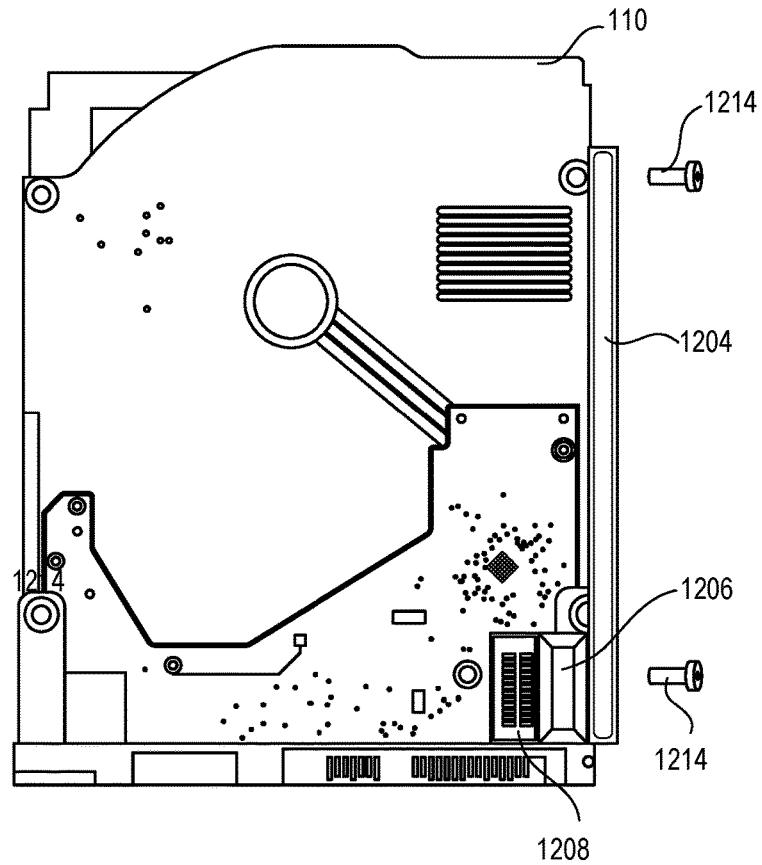
FIG. 13B is a top view illustration of the alignment mechanism of FIG. 12A attached to a unit under test and exposing the electrical interface of the unit under test through an opening or window in accordance with one or more aspects of the disclosure.
Figure 14:
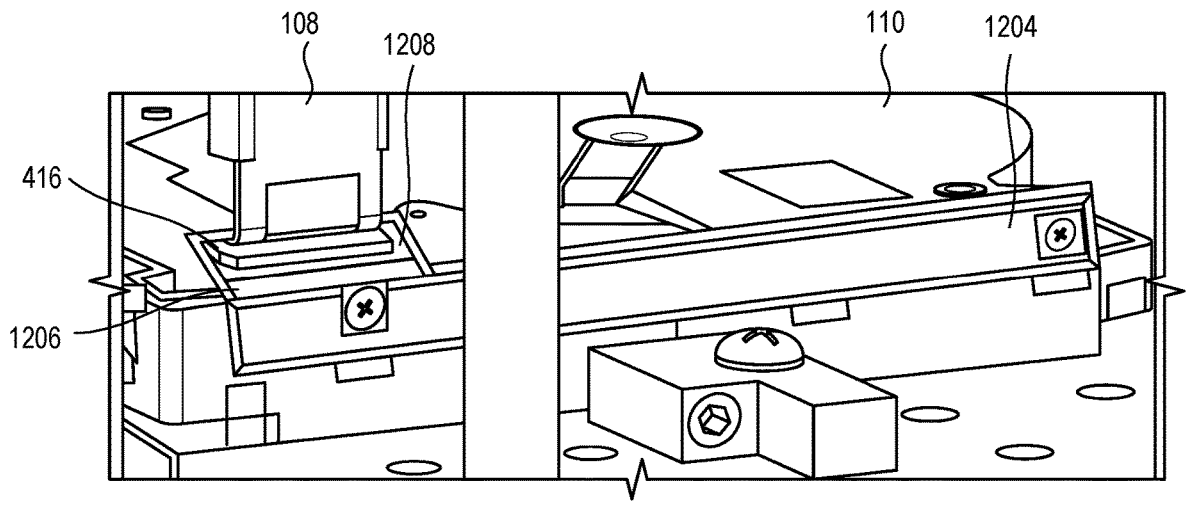
FIG. 14 is a perspective illustration a socket of a cable assembly of the apparatus of FIG. 3A inserted through the opening or window of the alignment mechanism and compressed against and engaged with the electrical interface (not visible) of the unit under test in accordance with one or more aspects of the disclosure.

The window frame portion 1206 extends orthogonally from the side portion 1204 and includes a frame that defines an opening or window 1208. The frame in the alignment bracket 1202 of FIG. 12A includes four sides or walls. In other configurations of the alignment bracket, such as shown in FIG. 12B, the frame may include three sides or walls that form a U-shaped opening. Returning to FIG. 12A, the window frame portion 1206 of the alignment bracket 1202 is located relative to the side portion 1204 (e.g., perpendicular) such that the frame of the window frame portion surrounds the electrical interface 112 of the unit under test 110 when the side portion is secured to the sidewall 1210 of the unit under test. As shown in FIG. 14, the window 1208 of the window frame portion 1206 is sized and shaped to receive the socket 416 of the cable assembly 108. The size and shape of the window 1208 are such that the edges of the socket 416 are immediately adjacent to the edges of the frame that defines the window. Accordingly, the configuration of the window 1208 and the socket 416 function together to ensure good alignment and electrical coupling between the electrical contacts 118 of the unit under test 110 and electrical socket pins 418 of the cable assembly 108.

With reference to FIG. 12B, in other configurations, the apparatus 100 may include an alignment bracket 1220 having a window frame portion 1222 with a three-sided frame (instead of four sided) that define a U-shaped opening or window 1224. The U-shaped window 1224 is sized and shaped to receive the socket 416 of the cable assembly 108. The size and shape of the U-shaped window 1224 are such that the edges of the socket 416 are immediately adjacent to the edges of the frame that define the window. By making the window frame portion 1222 three sided, rather than four, proper alignment of the socket 416 of the cable assembly 108 and the electrical interface 112 of the unit under test 110 is achieved by securely fitting the alignment bracket 1220 to the unit under test, while providing the added utility of being able to remove the alignment bracket 1220 after alignment of the socket 416 and electrical interface 112 to maintain the original width form factor of the unit while under test.

Figure 7:
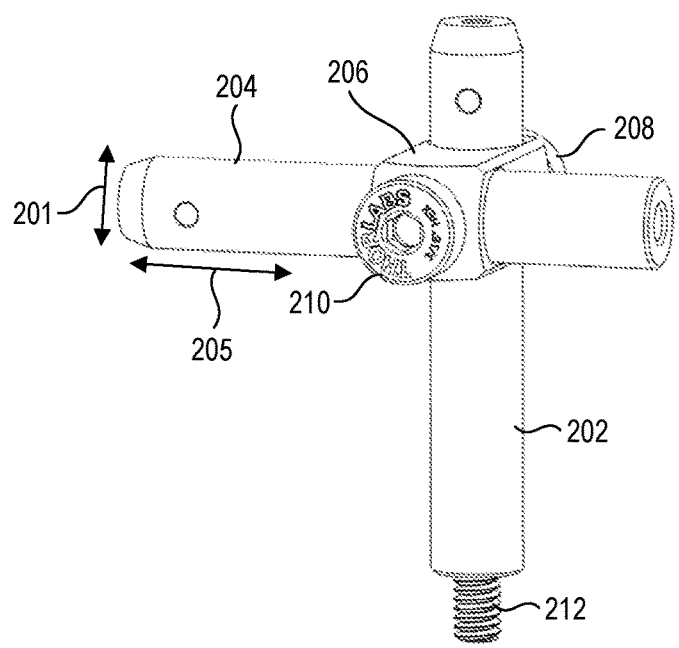
FIG. 7 is a perspective illustration of the crane assembly of the apparatus of FIG. 3A in accordance with one or more aspects of the disclosure.
Figure 8:
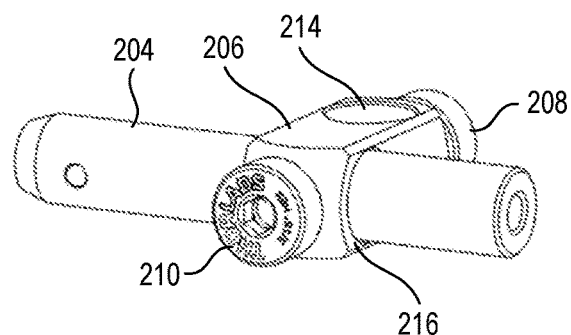
FIG. 8 is an partial exploded, perspective illustration of the crane assembly of FIG. 7 in accordance with one or more aspects of the disclosure.
Figure 8:
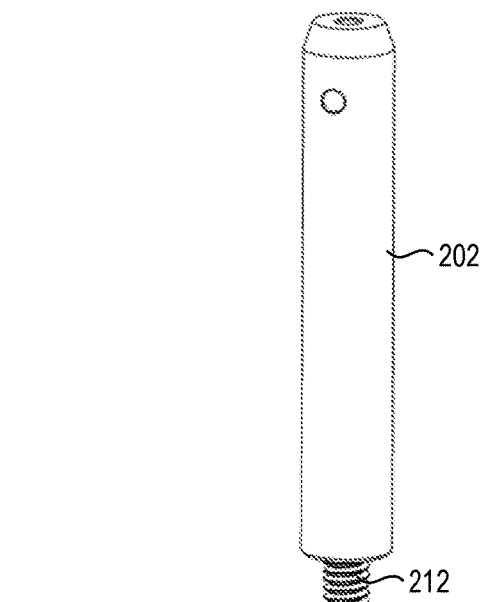
Figure 9:
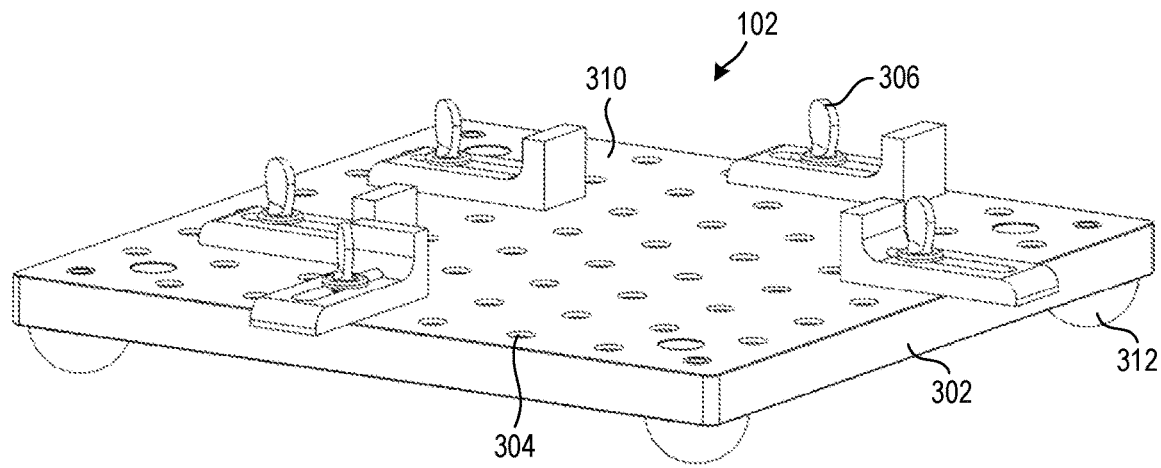
FIG. 9 is a perspective illustration of the baseplate assembly of the apparatus of FIG. 3A in accordance with one or more aspects of the disclosure.
Figure 10:
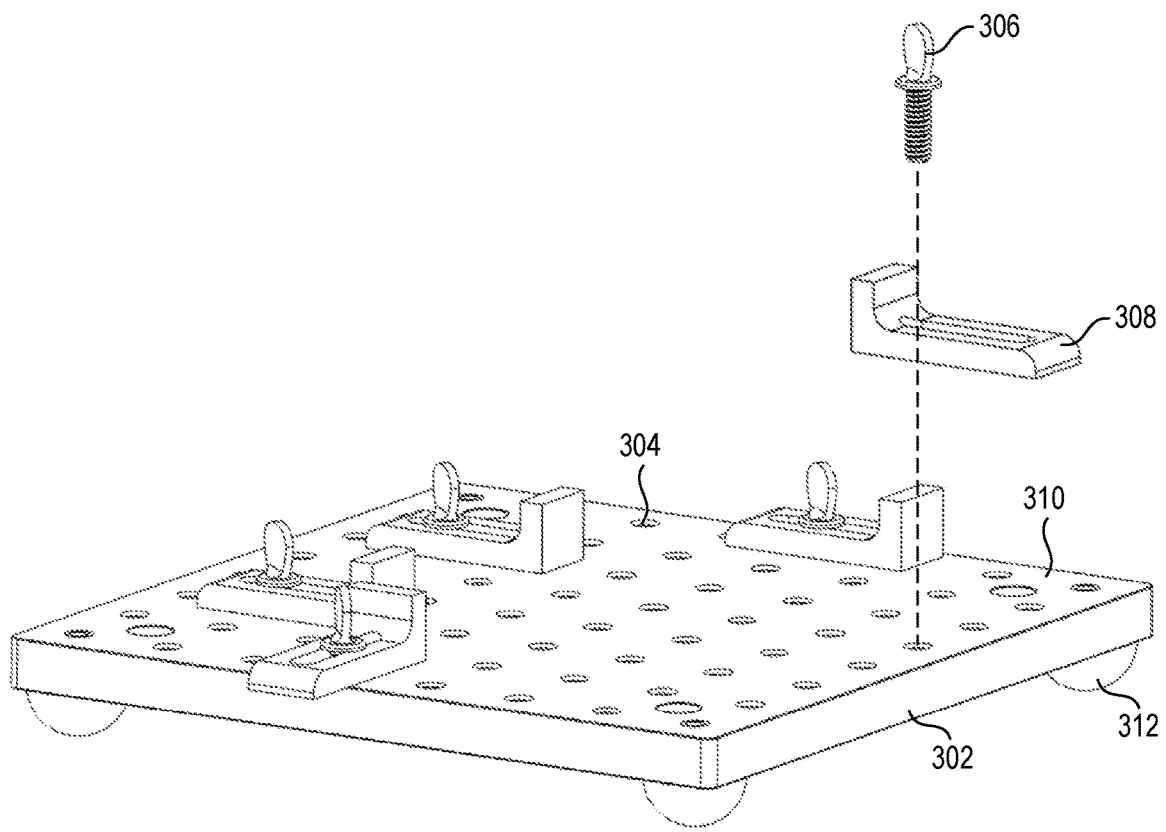
FIG. 10 is a partially exploded, perspective illustration of the baseplate assembly of FIG. 9 in accordance with one or more aspects of the disclosure.

With reference to FIGS. 2A, 2B, 2C, 7, and 8, the crane assembly 106 includes a first (vertical) arm 202, a second (horizontal) arm 204, a clamp 206, a first (vertical) control knob 208, a second (horizontal) control knob 210, and a coupling feature 212 that extends from the vertical arm. The vertical arm 202 and the horizontal arm 204 are each mechanically coupled with the clamp 206 such that the arms are orthogonal to each other. As shown in FIG. 8, the clamp 206 includes a first pass thru opening 214 configured to receive the vertical arm 202, and a second pass thru opening 216 configured to receive the horizontal arm 204. The relative diameters of the pass thru openings 214, 216 and the arms 202, 204 are such that the arms and clamp 206 are able to slide relative to each other, when the arms extend thru the respective openings. The crane assembly 106 is attached to the baseplate assembly 102 through a threaded coupling of the coupling feature 212 and threaded thru holes 304 in the plate 302 of the baseplate assembly.

With reference to FIGS. 7 and 8, the vertical control knob 208 is associated with the first pass thru opening 214. The vertical control knob 208 is configured to rotate to transition between an unclamped state and clamped state. The unclamped state enables up/down vertical movement 201 of the horizontal arm 204 and the clamp 206 relative to the vertical arm 202. In some embodiments, the unclamped state also enables rotational movement of the horizontal arm 204 and the clamp 206 relative to the vertical arm 202. The clamped state secures the horizontal arm 204 and the clamp 206 in place relative to the vertical arm 202. The up/down vertical movement 201 of the horizontal arm 204 is in a plane generally orthogonal to the plate 302 of the baseplate assembly 102, while the rotational movement of the horizontal arm 204 is in a plane generally parallel to the plate 302 of the baseplate assembly 102.

With reference to FIGS. 7 and 8, the horizontal control knob 210 is associated with the second pass thru opening 216. The horizontal control knob 210 is configured to rotate to transition between an unclamped state and a clamped state. The unclamped state enables back/forth, horizontal movement 205 of the horizontal arms 204 back and forth through the second pass thru opening 216 of the clamp 206. The clamped state secures the horizontal arm 204 in place relative to the clamp 206. The back/forth, horizontal movement of the horizontal arm 204 is in a plane generally parallel with the plate 302 of the baseplate assembly 102.

In one configuration, the vertical arm 202 and the horizontal arm 204 are cylindrical shape and formed of aluminum, and may be of various lengths. In one configuration, the arms 202, 204 have a diameter of 12.7 mm (0.5 inches) and lengths of 76.2 mm (3 inches). This small form factor of the crane assembly 106 allows for multiple crane assemblies to be attached to the plate 302 of the baseplate assembly 102. The ability to simply add another crane assembly 106 to the baseplate assembly 102 enables a test setup that employs multiple debug components, each separately attached to the same unit under test 110.

With reference to FIGS. 4, 5A-5D, 6A, and 6B, the bracket assembly 104 includes an articulating bracket 402, a fixed bracket 404, and a cable support bracket 406. The fixed bracket 404 is secured to the horizontal arm 204 of the crane assembly 106 with a screw 422. The articulating bracket 402 is coupled to the fixed bracket 404 by a knob 408. The cable support bracket 406 is secured to the articulating bracket 402 by screws 410.

Figure 5A:
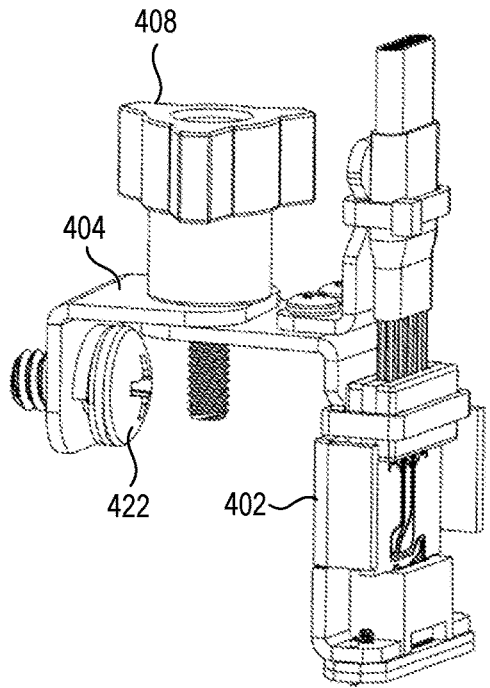
FIGS. 5A and 5B are perspective illustrations of the bracket assembly and the cable assembly of the apparatus of FIG. 3A in accordance with one or more aspects of the disclosure.
Figure 5B:
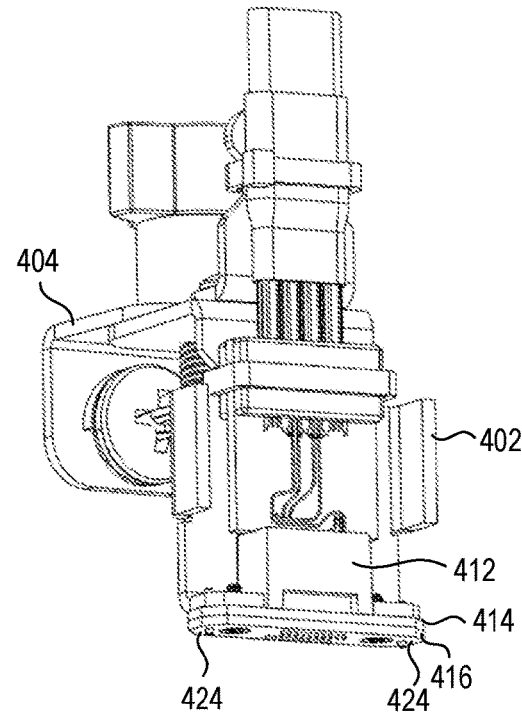
Figure 5C:
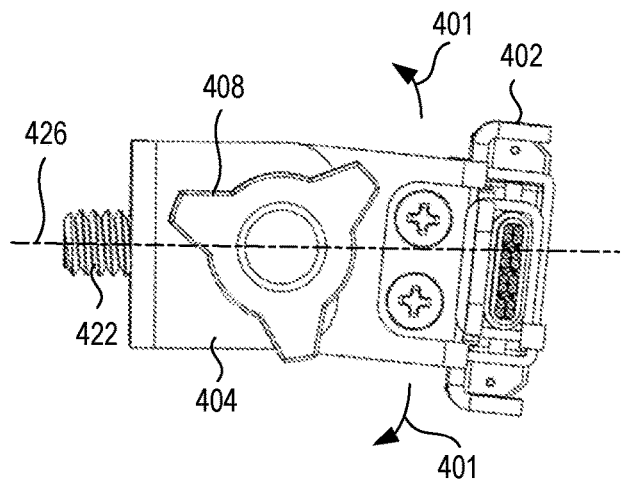
FIG. 5C is a top view illustration of the bracket assembly and the cable assembly of FIGS. 5A and 5B in accordance with one or more aspects of the disclosure.
Figure 5D:
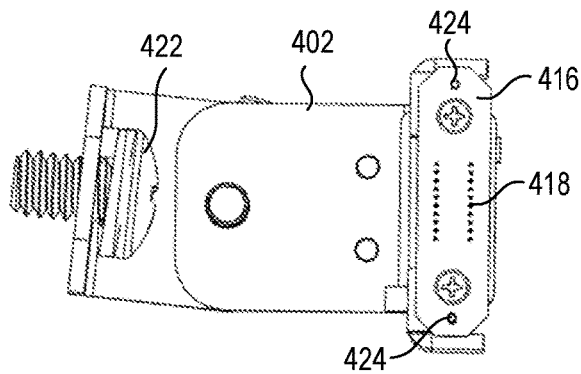
FIG. 5D is a bottom view illustration of the bracket assembly and the cable assembly of FIGS. 5A and 5B in accordance with one or more aspects of the disclosure.

With reference to FIG. 5C, the knob 408 is configured to transition between a loose state and a tight state. The loose state enables angular movement of the articulating bracket 402 relative to the fixed bracket 404. The tight state secures the articulating bracket 402 relative to the fixed bracket 404. The angular movement of the articulating bracket 402 is in a plane generally parallel with the plate 302 of the baseplate assembly 102, and with reference to FIG. 5C, is angular relative to an axis 426 through the fixed bracket 404 (and screw 422).

The bracket assembly 104 further includes a connector 412, an interposer circuit board 414 and a socket 416. The socket 416 includes high frequency electrical socket pins 418 that are arranged to mate with corresponding electrical contacts 118 of the unit under test 110. In some embodiments, the electrical socket pins 418 are configured to provide the necessary signal integrity for transferring multiple lines of 12 Gbps data. The socket 416 is secured to the end of the articulating bracket 402 by screws 420 and is thus removable from the articulating bracket 402. This allows for the use of a variety of sockets with different high frequency pin arrangements compatible with different electrical interfaces 112 of different units under test 110.

The interposer circuit board 414 is located between the end of the articulating bracket 402 and the socket 416. The interposer circuit board 414 is configured to electrically couple with the high frequency electrical socket pins 418 of the socket 416, and to route the electrical signals from the socket pins to the connector 412, which in turn, routes the signals to a connector 606 of the cable assembly 108.

The articulating bracket 402 includes pins 424 that extend from the bottom of the bracket. These pins 424 are sized and arranged to extend through respective side holes of the interposer circuit board 414 and the socket 416 so as to extend beyond the bottom surface of the socket. The exposed portions of these pins 424 function as alignment features 424. As previously described, the alignment pins are configured to engage corresponding alignment features 114, e.g., holes, associated with the electrical interface 112 of the unit under test 110, to facilitate proper alignment between the electrical contacts 118, e.g., receptacles, pads, vias or other suitable form factor, of the unit under test 110, and the electrical couplings 418, e.g., pogo pins or other suitable socket pins, of the socket 416, to thereby provide a high quality electrical contact between the two.

FIGS. 6A and 6B illustrate an embodiment of the cable assembly 108. The cable assembly 108 includes a first end 602 and a second end (not shown) and a cable 608 that extends between the ends. The first end 602 includes a blade edge connector 606 having an interposer end 610 and a cable-connector end 612. The interposer end 610 is configured to mechanically couple with the connector 412 of the bracket assembly 104, and thereby electrically connect with the interposer circuit board 414 and socket 416 of the bracket assembly. The cable-connector end 612 of the blade edge connector 606 is configured to connect to a blade-receptacle connector 614 of the cable 608.

The cable 608 includes a debugger connector (not shown) at the end opposite the blade-receptacle connector 614. The debugger connector is configured to connect with the debugger component. The cable 608 is configured to translate the signals from the blade-receptacle connector 614 to the debugger connector. In some embodiments, the debugger connector is a standard ERF8 connector.

The cable assembly 108 is secured to the bracket assembly 104 with zip ties 616, 618. The zip ties 616, 618 may be broken to allow for separation of the cable assembly 108 from the bracket assembly 104, and installation of a different cable assembly.

With reference to FIGS. 3A-3D, 9, and 10, the baseplate assembly 102 includes a plate 302 or breadboard having a plurality of threaded thru holes 304, each configured to receive a thumb screw 306 to secure a stabilizing bumper 308 in place against a surface 310 of the plate. In one configuration, the plate 302 is an aluminum plate and the thru holes 304 comprises eight rows of thru holes, each having eight thru holes. This configuration of the plate 302 may be referred to herein as a 8×8 plate.

The plate 302 design allows for the stabilizing bumpers 308 and the vertical arm 202 of the crane assembly 106 to be easily screwed down and secured. This plate 302 design also provides flexibility to move the stabilizing bumpers 308 and the vertical arm 202 of the crane assembly 106 to different location on the plate to account for assorted sizes and configurations of units under test 110. The plate 302 design also allows for the attachment of multiple crane assemblies 106 in cases where a unit under test has multiple electrical interfaces 112.

Figure 15:
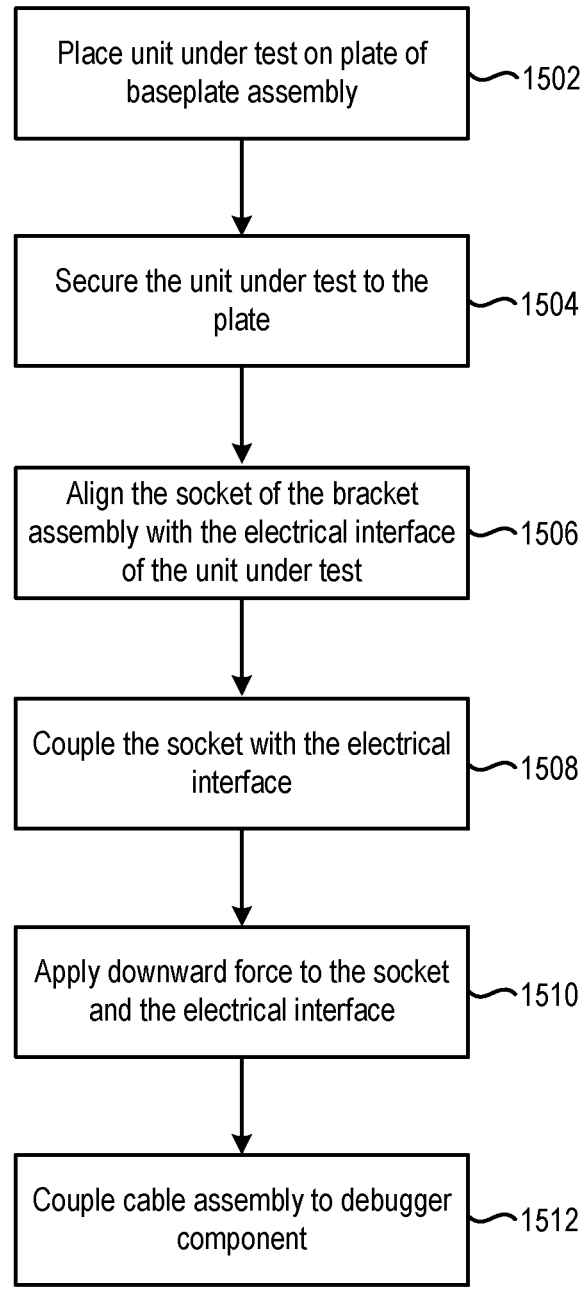
FIG. 15 is a flowchart of a method of use of the apparatus of FIG. 1A in accordance with one or more aspects of the disclosure.

With reference to FIG. 15, a method of use of the apparatus 100 is described.

At block 1502, a unit under test 110 is placed on the plate 302 of a baseplate assembly 102. To this end, the unit under test may be positioned on the top surface of the plate 302 of the baseplate assembly 102 in a location near the bracket assembly 104 and the cable assembly 108. The unit under test 110 is placed on the plate 302 so that the electrical interface 112 (or debugger footprint) of the unit under test is in a first plane parallel to a plane defined by the top surface of the plate.

At block 1504, the unit under test 110 is secured to the plate 302. To this end, the unit under test may be secured in place on the top surface of the plate 302 using stabilizing bumpers 308 and thumb screws 306.

In some embodiments, a top surface of a plate 302, stabilizing bumpers 308, and thumb screws 306 correspond to a means for positioning the unit under test with the electrical interface in a first plane. In some embodiments, other structures equivalent in nature with one or more of the plate 302, the stabilizing bumpers 308, and thumb screws 306 may similarly correspond to a means for positioning the unit under test with the electrical interface in a first plane.

At block 1506, the socket 416 of the bracket assembly 104 is aligned above the electrical interface 112 of the unit under test 110. To this end, the socket 416 of the bracket assembly 104 may be initially positioned in a second plane parallel to and above the first plane in which the electrical interface 112 of the unit under test 110 is located without regard for vertical alignment of the two.

In some embodiments, a vertical arm 202, a horizontal arm 204 coupled to the socket 416, and a clamp 206 configured to receive each of the vertical arm and the horizontal arm and arrange the arms orthogonal to each other, correspond to a means for positioning a socket in a second plane parallel to the first plane. In some embodiments, other structures equivalent in nature with one or more of a vertical arm 202, a horizontal arm 204 coupled to the socket 416, and a clamp 206 configured to receive each of the vertical arm and the horizontal arm and arrange the arms orthogonal to each other may similarly correspond to a means for positioning a socket in a second plane parallel to the first plane.

Continuing at block 1506, once positioned in a second plane, the location of the socket 416 is then manipulated to vertically align the socket above the electrical interface 112 of the unit under test 110. To obtain vertical alignment between the socket 416 and the electrical interface 112, the horizontal control knob 210 may be moved to its unclamped state and the horizontal arm 204 moved back/forth as needed to align the socket 416 above the electrical interface 112 of the unit under test 110. The knob 408 of the bracket assembly 104 may be moved to its loose state and the articulating bracket 402 moved angularly to further align the socket 416 above the electrical interface 122 of the unit under test. Once vertical alignment is obtained, the horizontal control knob 210 may be moved to its clamped state and the knob 408 may be moved to its tight state.

In some embodiments, a vertical arm 202, a horizontal arm 204 coupled to the socket 416, a clamp 206 configured to receive each of the vertical arm and the horizontal arm, and a horizontal control knob 210 associated with the clamp correspond to a means for aligning the socket above the electrical interface. In this means structure, the horizontal knob 210 is configured to transition between a clamped state and an unclamped state, and the horizontal arm 204 and the clamp 206 are configured to enable movement of the socket 416 in a horizontal direction 205 relative to the electrical interface 112 of the unit under test 110 when the horizontal knob is in the unclamped state. In some embodiments, other structures equivalent in nature with one or more of a vertical arm 202, a horizontal arm 204 coupled to the socket 416, a clamp 206 configured to receive each of the vertical arm and the horizontal arm, and a horizontal control knob 210 associated with the clamp correspond to a means for aligning the socket above the electrical interface.

In some embodiments, the means for aligning the socket 416 above the electrical interface 112 further includes a fixed bracket 404 coupled to the horizontal arm 204, an articulating bracket 402 comprising the socket 416 and coupled to the fixed bracket, and a knob 408 configured to couple the articulating bracket to the fixed bracket. In this means structure, the knob 408 is configured to transition between a tight state and a loose state, and the articulating bracket 402 is configured to enable movement of the socket 416 in an angular direction relative to an axis 426 of the fixed bracket when the knob is in the loose state.

At block 1508, the socket 416 of the bracket assembly 104 is coupled with the electrical interface 112 of the unit under test 110. To this end, the vertical control knob 208 may be moved to its unclamped state and the horizontal arm 204 and clamp 206 moved down as needed to establish electrical coupling between the socket 416 and the electrical interface 112. If needed, the horizontal control knob 210 may be moved to its unclamped state and the knob 408 may be moved to its loose state in order to refine the alignment of the socket 416 with the electrical interface 112.

In some embodiments, a vertical arm 202, a horizontal arm 204 coupled to the socket 416, a clamp 206 configured to receive each of the vertical arm and the horizontal arm, and a vertical control knob 208 associated with the clamp correspond to a means for moving the socket into electrical contact with the electrical interface 112 of the unit under test 110. In this means structure, the vertical control knob 208 is configured to transition between a clamped state and an unclamped state, and the horizontal arm 204 and the clamp 206 are configured to enable movement of the socket 416 in a vertical direction 201 relative to the electrical interface when the vertical knob is in the unclamped state. In some embodiments, other structures equivalent in nature with one or more of a vertical arm 202, a horizontal arm 204 coupled to the socket 416, a clamp 206 configured to receive each of the vertical arm and the horizontal arm, and a vertical control knob 208 associated with the clamp correspond to a means for moving the socket into electrical contact with the electrical interface 112 of the unit under test 110.

In some embodiments, the means for moving the socket into electrical contact with the electrical interface 112 of the unit under test 110 may further include the horizontal control knob 210 and the knob 408. In this means structure, the horizontal control knob 210 may be moved to its unclamped state and the knob 408 may be moved to its loose state in order to enable alignment of the socket 416 with the electrical interface 112 through further horizontal and/or angular movement of the socket.

At block 1510, downward, compressive force is applied to the socket 416 to securely establish and maintain the electrical coupling between the electrical socket pins 418 of the socket 416 and the electrical contacts 118 of the electrical interface 112. To this end, the vertical control knob 208 may be maintained in its unclamped state, while downward pressure is applied to the horizontal arm 204 and clamp 206 (and thus to the socket 416), with the vertical control knob 208 being moved to its clamped state while such downward pressure is being applied.

In some embodiments, a vertical control knob 208 configured to transition between a clamped and unclamped state corresponds to a means for securing the socket 416 in place relative to the electrical interface 112 while applying compressive force by the socket against the electrical interface. In this means structure, the vertical control knob 208 is configured to be moved to the clamped state to thereby prevent vertical movement 201 of the socket relative to the electrical interface 112. In some embodiments, other structures equivalent in nature with a vertical control knob 208 configured to transition between a clamped and unclamped state may correspond to a means for securing the socket 416 in place relative to the electrical interface 112 while applying compressive force by the socket against the electrical interface.

At block 1512, the second end of the cable assembly 108 is coupled to the debugger component.

In some embodiments a cable assembly 108 corresponds to a means for electrically coupling the socket with the debugging component. In some embodiments, other structures equivalent in nature with a cable assembly 108 may correspond to a means for electrically coupling the socket with the debugging component.

Thus disclosed is an apparatus 100 that enables electrical coupling between a unit under test 110 and a debugging component without any rework requirements, e.g., soldering, of the unit under test. Reworking a unit under test requires heat to be applied to melt the solder. Applying such heat often changes other variables that can drastically change the failure mode. For example, soldering heat sometimes removes the failure root cause altogether (i.e. other improper solder connections may now make full contact because they also melted during the rework). Also, such heat may damage the unit under test, e.g., warp PCBAs, cause electrical shorts, etc.

The disclosed apparatus 100 also provides flexibility in electrical coupling a unit under test 110 and a debugging component. The ability to move and rotate the bracket assembly 104 and cable assembly 108 via the crane assembly 106 allows full access to all test points on the unit under test regardless of location of the electrical interface 112. The crane assembly design accommodates any type of electrical interface 112 footprint and location. This allows for flexibility in PCBA design in that the electrical interface 112 of the unit under test 110 may be placed at different locations without concerns about accessibility for debugging.

The disclosed apparatus 100 also provides increased visibility of the unit under test (e.g., device under test) which further increases debug capabilities. Many failures are system related and require both attachment of a debugger component for firmware control, as well as access to a multitude of test points of the unit under test. By providing full visibility of the unit under test, the disclosed apparatus 100 enables easy access to other test points.

Furthermore, a variety of units under test may be debugged using the apparatus. Previously, only units under test with an emulator/debug connector attached could take advantage of the full debug capabilities. If a failure was unit specific, the unit would need to be removed, reworked, and have the failure reproduced before efficient debug could take place. The apparatus 100 allows for "hot plug" setups, where an engineer can attach a debugger while it is still powered and in a failure state. This saves engineering time and resources by enabling immediate debug for faster turnaround times, not requiring an engineer to rework the board, and not having to spend the time to reproduce the bug.

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. An apparatus for electrically coupling an electrical interface of a unit under test with a debugging component, the apparatus comprising:
    a bracket assembly comprising a socket configured to electrically couple with the electrical interface;
    a baseplate assembly having a plate, and configured to secure the unit under test on the plate;
    a crane assembly coupled to the bracket assembly and configured to:
        enable movement of the socket relative to the electrical interface in each of a horizontal direction, a vertical direction, and an angular direction; and
        secure the socket in place relative to the electrical interface by applying a force by the socket against the electrical interface; and a cable assembly configured to electrically couple with the socket at a first end and with the debugging component at a second end.

2. The apparatus of claim 1, wherein the crane assembly comprises:
a vertical arm;
a horizontal arm coupled to the bracket assembly; and
a clamp configured to receive each of the vertical arm and the horizontal arm, the clamp having a vertical control knob and a horizontal control knob.

3. The apparatus of claim 2, wherein:
each of the vertical control knob and the horizontal control knob is configured to transition between a clamped state and an unclamped state; and
the horizontal arm and the clamp are configured to:
enable movement of the socket in the vertical direction relative to the electrical interface when the vertical control knob is in the unclamped state, and
enable rotational movement of the socket about an axis of the vertical arm when the vertical control knob is in the unclamped state.

4. The apparatus of claim 2, wherein:
each of the vertical control knob and the horizontal control knob is configured to transition between a clamped state and an unclamped state; and
the horizontal arm and the clamp are configured to:
enable movement of the socket in the vertical direction relative to the electrical interface when the vertical control knob is in the unclamped state, and
prevent movement of the socket in the vertical direction when the vertical control knob is in the clamped state.

5. The apparatus of claim 2, wherein:
each of the vertical control knob and the horizontal control knob is configured to transition between a clamped state and an unclamped state; and
the horizontal arm and the clamp are configured to:
enable movement of the socket in the horizontal direction relative to the electrical interface when the horizontal control knob is in the unclamped state; and
prevent movement of the socket in the horizontal direction when the horizontal control knob is in the clamped state.

6. The apparatus of claim 2, wherein the vertical arm and the horizontal arm are orthogonal each other.

7. The apparatus of claim 2, wherein the bracket assembly comprises:
a fixed bracket coupled to the horizontal arm of the crane assembly;
an articulating bracket comprising the socket and coupled to the fixed bracket; and
a knob configured to couple the articulating bracket to the fixed bracket and to transition between a tight state and a loose state,
wherein:
the articulating bracket is configured to enable movement of the socket in the angular direction relative to an axis of the fixed bracket when the knob is in the loose state, and
the articulating bracket is configured to prevent movement of the socket in the angular direction when the knob is in the tight state.

8. The apparatus of claim 1, wherein:
the electrical interface comprises a mechanical feature, and
the socket comprises a corresponding mechanical feature configured to engage the mechanical feature of the electrical interface.

9. The apparatus of claim 8, wherein the mechanical feature of the electrical interface comprises a hole and the corresponding mechanical feature comprises a pin configured to fit in the hole.

10. The apparatus of claim 1, further comprising an alignment bracket configured to couple to the unit under test, the alignment bracket comprising:
a side portion configured to secure to a sidewall of the unit under test; and
a window frame portion extending orthogonally from the side portion, the window frame portion having a frame defining a window,
wherein:
the window frame portion is located relative to the side portion such that the frame at least partially surrounds the electrical interface of the unit under test when the side portion is secured to the sidewall, and
the window of the window frame portion is shaped to receive the socket.

11. The apparatus of claim 10, wherein the shape of the window is such that edges of the socket are immediately adjacent to edges of the frame that defines the window.

12. The apparatus of claim 1, wherein:
the electrical interface of the unit under test comprises a visual marker forming an outline, and
the socket has a perimeter forming an outline that substantially matches the outline formed by the visual marker.

13. An apparatus for electrically coupling an electrical interface of a unit under test with a debugging component, the apparatus comprising:
means for positioning the unit under test so that the electrical interface is in a first plane;
means for positioning a socket in a second plane parallel to, and spaced apart from, the first plane;
means for aligning the socket with the electrical interface;
means for moving the socket into electrical contact with the electrical interface;
means for securing the socket in place relative to the electrical interface by applying a force by the socket against the electrical interface; and
means for electrically coupling the socket with the debugging component.

14. The apparatus of claim 13, wherein the means for positioning a socket in a second plane parallel to the first plane comprises:
a vertical arm;
a horizontal arm coupled to the socket; and
a clamp configured to receive each of the vertical arm and the horizontal arm and arrange the vertical arm and the horizontal arm orthogonal to each other.

15. The apparatus of claim 13, wherein the means for aligning the socket with the electrical interface comprises:
a vertical arm;
a horizontal arm coupled to the socket; and
a clamp configured to receive each of the vertical arm and the horizontal arm, the clamp having a horizontal control knob,
wherein:
the horizontal control knob is configured to transition between a clamped state and an unclamped state, and
the horizontal arm and the clamp are configured to enable movement of the socket in a horizontal direction relative to the electrical interface when the horizontal control knob is in the unclamped state.

16. The apparatus of claim 15, wherein the means for aligning the socket with the electrical interface further comprises:
a fixed bracket coupled to the horizontal arm;
an articulating bracket comprising the socket and coupled to the fixed bracket; and
a knob configured to couple the articulating bracket to the fixed bracket and to transition between a tight state and a loose state,
wherein the articulating bracket is configured to enable movement of the socket in an angular direction relative to an axis of the fixed bracket when the knob is in the loose state.

17. The apparatus of claim 13, wherein the means for moving the socket into electrical contact with the electrical interface;
a vertical arm;
a horizontal arm coupled to the socket; and
a clamp configured to receive each of the vertical arm and the horizontal arm, the clamp having a vertical control knob,
wherein:
the vertical control knob is configured to transition between a clamped state and an unclamped state, and
the horizontal arm and the clamp are configured to enable movement of the socket in a vertical direction relative to the electrical interface when the vertical control knob is in the unclamped state.

18. The apparatus of claim 17, wherein the means for securing the socket in place relative to the electrical interface by applying the force by the socket against the electrical interface comprises the vertical control knob in the clamped state.

19. A method of electrically coupling an electrical interface of a unit under test with a debugging component using the apparatus of claim 13, the method comprising:
positioning the unit under test so that the electrical interface lies in a first plane;
positioning a socket in a second plane parallel to the first plane;
aligning the socket with the electrical interface;
moving the socket into abutting contact with the electrical interface;
securing the socket in place relative to the electrical interface by applying a force by the socket against the electrical interface; and
electrically coupling the socket with the debugging component.

20. The method of claim 19, wherein the unit under test comprises at least one of a solid state storage device or a magnetic storage device.

* * * * *